(12) United States Patent
Suzuki et al.

(10) Patent No.: US 7,009,192 B2
(45) Date of Patent: Mar. 7, 2006

(54) CHARGED PARTICLE BEAM APPLICATION APPARATUS

(75) Inventors: Hiroyuki Suzuki, Hitachinaka (JP); Shouji Tomida, Hitachinaka (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 10/864,420

(22) Filed: Jun. 10, 2004

(65) Prior Publication Data

US 2004/0251427 A1     Dec. 16, 2004

(30) Foreign Application Priority Data

Jun. 11, 2003 (JP) .............................. 2003-166980

(51) Int. Cl.
*H01J 37/21* (2006.01)
*G21K 7/00* (2006.01)
*G21N 23/00* (2006.01)

(52) U.S. Cl. ............... 250/491.1; 250/306; 250/307; 250/309; 250/310; 250/311

(58) Field of Classification Search .......... 250/491.1, 250/492.1–3, 306, 307, 309–31, 396 ML, 250/396 R, 397–400
See application file for complete search history.

(56) References Cited

U.S. PATENT DOCUMENTS

| | | | |
|---|---|---|---|
| 4,694,170 A * | 9/1987 | Slodzian et al. | 250/309 |
| 5,270,552 A | 12/1993 | Ohnishi et al. | |
| 5,512,747 A | 4/1996 | Maeda | |
| 5,677,530 A * | 10/1997 | Sato et al. | 250/310 |
| 6,534,766 B1 * | 3/2003 | Abe et al. | 250/307 |
| 6,538,249 B1 * | 3/2003 | Takane et al. | 250/310 |
| 6,576,902 B1 * | 6/2003 | Kuwahara | 250/310 |
| 6,642,675 B1 * | 11/2003 | Ogasawara | 315/370 |
| 6,653,633 B1 * | 11/2003 | Takane et al. | 250/310 |

(Continued)

FOREIGN PATENT DOCUMENTS

| | | |
|---|---|---|
| JP | 11-213935 | 8/1999 |
| JP | 2000-251823 | 9/2000 |

OTHER PUBLICATIONS

D Heddle, "Electrostatic Lens Systems", <http://bookmark-physics.iop.org/bookpge.htm?book=481h>.*

(Continued)

*Primary Examiner*—John R. Lee
*Assistant Examiner*—Bernard E. Souw
(74) *Attorney, Agent, or Firm*—Dickstein Shapiro Morin & Oshinsky LLP

(57) ABSTRACT

The present invention enables the same target to be precisely machined and observed in a short time when a focal distance of a charged particle beam is changed or if the focal distances of charged particle beams are not equal on a sample. The present invention provides a charged particle beam application apparatus having a stage device used to move a sample in at least three axial directions, a charged particle beam optical system having an optical axis inclined from a surface of the sample to irradiate the sample with a charged particle beam, and a display device that displays an image formed by the charged particle beam optical system, the apparatus including a correction table indicating a relationship between both focal distance and optical conditions for said charged particle beam optical system and a position of the sample, and an arithmetic section that calculates the position of the sample, the arithmetic section calculating the amount of correction for the position of the sample so that when the focal distance of the charged particle beam changes, a position of a target on the sample is placed in the center of a visual field of a screen of the display device.

3 Claims, 7 Drawing Sheets

U.S. PATENT DOCUMENTS

| | | | |
|---|---|---|---|
| 6,753,518 B1 * | 6/2004 | Watanabe et al. | 250/201.3 |
| 6,777,697 B1 * | 8/2004 | Yui et al. | 250/492.22 |
| 2001/0025925 A1 * | 10/2001 | Abe et al. | 250/307 |
| 2002/0008200 A1 * | 1/2002 | Kuwahara | 250/310 |
| 2002/0109090 A1 * | 8/2002 | Nakasuji et al. | 250/311 |
| 2005/0045821 A1 * | 3/2005 | Noji et al. | 250/311 |

OTHER PUBLICATIONS

Portland State University—Electron Optics Course—Summer 2001 session, PH 410, PH 510, <http://physics.pdx.edu/faculty_files/re/ElectronOptics/>.*

SIMION 3D™ 7.0 Ion and Electron Optics Software, <http://www.sisweb.com/simion.htm>.*

* cited by examiner

CHARGED PARTICLE BEAM APPLICATION APPARATUS

BACKGROUND OF THE INVENTION

1. Field of the Invention

The present invention relates to a charged particle beam application apparatus suitably used to machine semiconductors, and in particular, to a sample movement mechanism in a charged particle beam application apparatus.

2. Background Art

With an increase in the degree of integration of semiconductor devices and a decrease in their size, it has become essential in the market to improve the yield of semiconductor devices by eliminating defective processes. A process of manufacturing semiconductor devices using wafers generally analyzes defects using an inspection-scanning electron microscope (SEM) that compares and checks circuit pattern images using a SEM, a critical dimension scanning electron microscope (CD-SEM) that measures the width or the like of circuit patterns using a SEM, or a transmission electron microscope (TEM) having a higher resolution.

Further, to use a transmission electron microscope to observe and analyze defects in a circuit pattern, an ion beam machining apparatus using a focused ion beam (FIB) is used as means for producing a sample. For example, JP Patent Publication (Kokai) No. 05-52721 discloses a method of separating a sample from a wafer.

The series of inspection steps require the early discovery of defects and the quick feedback of this information to the process. Accordingly, an apparatus using a plurality of charged particle beams is desired which eliminates a time loss resulting from differences in the time of delivery and reception of wafers or samples between apparatuses or differences in operability between the apparatuses to put the apparatuses together or make them inline.

For example, JP Patent Publication (Kokai) No. 11-213935 discloses a dual beam apparatus using charged particles from an ion particle beam machining apparatus and a scanning electron microscope. As shown in FIG. 6, this apparatus has an ion particle beam machining apparatus column 601 and a scanning electron microscope column 602 arranged at a certain angle. A machined or observed point of a sample 607 on a stage 618 is irradiated with charged particle beams drawn out of an ion source 603 and an electron gun 609. The stage 618 is a U-centric staged with four axes for horizontal two-dimensional movements, rotations, and inclinations. A stage control section 619 is controlled by a host controller 614.

In this case, the U-centric function is effective only if the observed point of the ion charged beam machining apparatus coincides with the observed point of the scanning electron microscope. Even if the ion charged particle beam machining apparatus and the scanning electron microscope are centered, the observed points may deviate from each other when the optical conditions for the ion charged particle beam machining apparatus and scanning electron microscope are changed.

Further, it is assumed that the U-centric function does not have a stage (Z stage) for the direction of height of the sample. If for example, the sample is a semiconductor wafer of φ300 mm, it may be bent by 200 μm in the direction of the sample height. Accordingly, it may be disadvantageous in a practical sense to electrically control the optical system to focus the sample surface because an optical resolution (magnification) is in inverse proportion to the range of the control.

Various well-known examples have been disclosed in connection with the focal distance of the ion particle beam machining apparatus and scanning electron microscope as well as a method of controlling an optical condition, that is, the focal distance. For example, JP Patent Publication (Kokai) No. 7-176285 discloses an automatic focusing mechanism of the scanning electron microscope.

As shown in FIGS. 7 and 8, in the automatic focusing mechanism of the scanning electron microscope disclosed in JP Patent Publication No. 7-176285, an objective 703 focuses an electron beam 701 generated by an electron gun (not shown) and irradiates a sample 704 with the electron beam 701. A stage 715 on which a sample is placed receives coordinate data on a point to be measured from a wafer information file 716 in which the coordinates of the measured point are registered. The stage 715 moves the wafer to the appropriate measured point. X deflection coils 702X and 702Y are used to scan the electron beam 701 over the sample. A detector 714 detects secondary electrons 714 generated by the sample 704 and transmits them to a focused point detecting device 710 via an amplifier 706. The focused point detecting device 710 is composed of a focus control device that sequentially varies an excitation current for the objective 703 step by step, a signal intensity differential device that differentiates the intensity signal, and a peak detecting device that determines a peak of a differential value of the intensity signal. These arrangements enable the focal distance, that is, the focal height of an electron beam shown in FIG. 8 to be automatically adjusted by determining the differential value of the secondary electron signal to control the objective.

If the charged particle beam is not applied perpendicularly to the sample surface as in the case of the previously described well-known example (JP Patent Publication (Kokai) No. 11-213935), a change in focal distance changes the focus position in a horizontal direction of the sample surface. Accordingly, the system must be complicated in order to correct optical conditions for the deflection coils in addition to the objective.

JP Patent Publication (Kokai) No. 200-251823 discloses a method of inclining a sample (sample stage) to change the focal distance n the basis of the sample and a charged particle beam and using an image shift function to correct the amount of bending. This publication describes a method of correcting bending in the X and Z directions or in the Y and Z directions which may occur when an axis of tilt is changed particularly if there is a deviation between the observed position of the sample and an U-centric axis as shown in FIGS. 9 and 10. The correction is carried out on the basis of optical conditions, that is, by using an electric image shift function or using a motor to mechanically drive the stage.

However, this method must use a certain method of measurement to prestore, for each inclination, the relationship between the X and Z coordinates, which is a basis for conversions of the amount of bending. However, this relationship is a mechanical specific parameter, so that if the relationship between the sample and the axis of tilt of the stage is changed as a result of replacement of the sample or the like, the parameter must be measured again.

[Patent 1]
JP Patent Publication (Kokai) No. 05-52721
[Patent 2]
JP Patent Publication (Kokai) No. 11-213935
[Patent 3]
JP Patent Publication (Kokai) No. 7-176285
[Patent 4]
JP Patent Publication (Kokai) No. 2000-251823

SUMMARY OF THE INVENTION

It is a first object of the present invention to provide a charged particle beam application apparatus in which if a charged particle beam is not applied perpendicularly to a sample, an observed point of the sample on a display screen, which is a target, remains the same (the same target remains in the center of the display screen) even when the focal distance of the charged particle beam changes.

It is a second object of the present invention to provide a charged particle beam application apparatus in which if the apparatus is provided with a plurality of charged particle beams, an observed point of the sample on a display screen, which is a target, remains the same (the same target remains in the center of the display screen) even when the charged particle beam used is switched because the focal distances of the respective charged particle beams are not equal on the sample.

It is a third object of the present invention to provide a charged particle beam application apparatus in which if the apparatus is provided with a plurality of charged particle beams, an observed point of the sample on a display screen, which is a target, remains the same (the same target remains in the center of the display screen) even when the charged particle beam used is switched while changing the focal distances of the charged particle beams, that is, their workpiece distances.

According to the present invention, there is provided a charged particle beam application apparatus having a stage device used to move a sample in at least three axial directions, a charged particle beam optical system having an optical axis inclined from a surface of the sample to irradiate the sample with a charged particle beam, and a display device that displays an image formed by the charged particle beam optical system, the apparatus comprising a correcting table indicating a relationship between both focal distance and optical conditions for the charged particle beam optical system and a position of the sample, and an arithmetic section that calculates the position of the sample, the arithmetic section calculating the amount of correction for the position of the sample so that when the focal distance of the charged particle beam changes, a position of a target on the sample is placed in the center of a visual field of a screen of the display device.

DETAILED DESCRIPTION OF THE PREFERRED EMBODIMENTS

Figure 1:
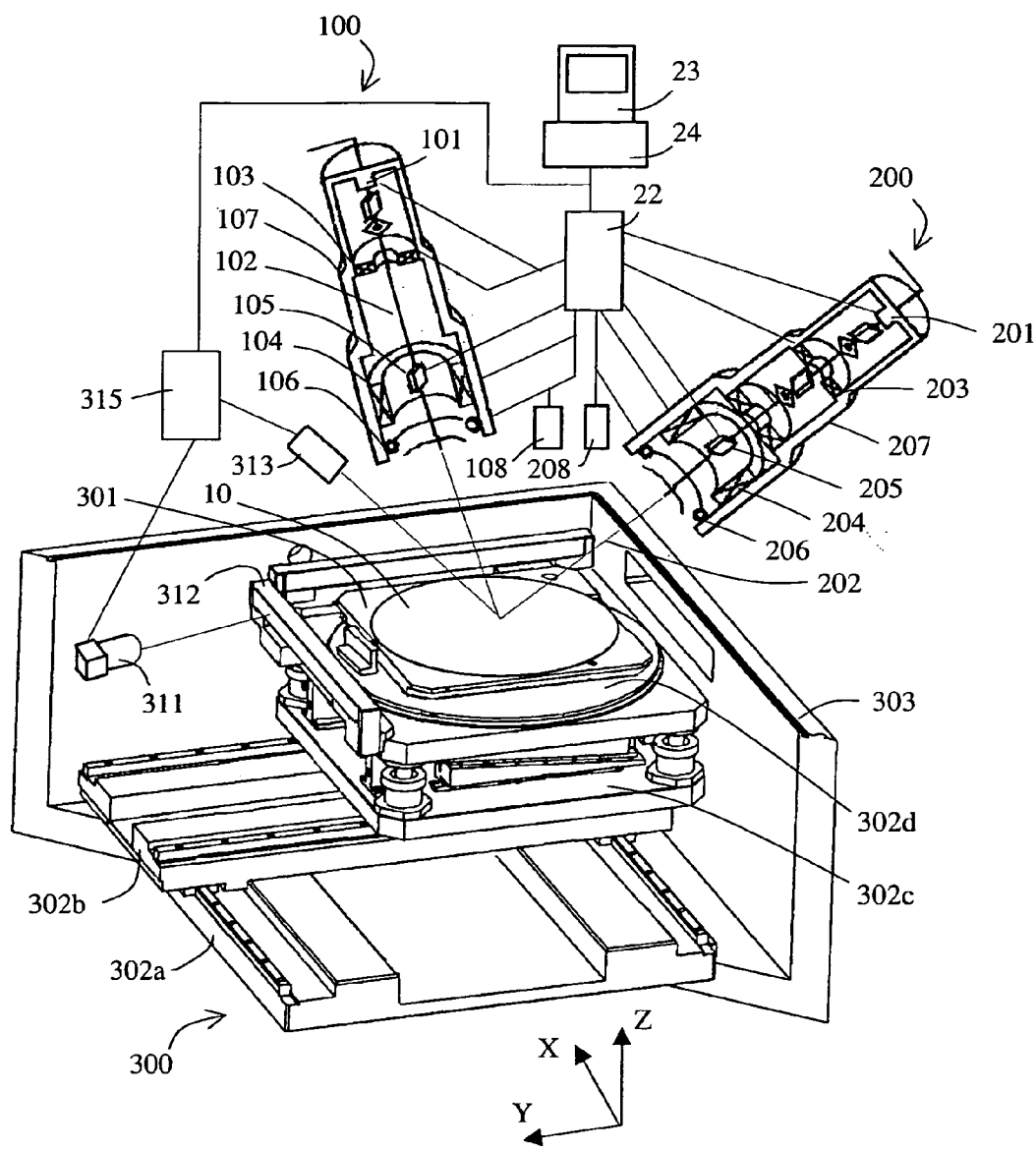
FIG. 1 is a schematic perspective view showing essential parts of a charged particle beam application apparatus according to the present invention.

With reference to FIG. 1, description will be given of an example of a charged particle beam application apparatus according to the present invention. The charged particle beam application apparatus in the present example has an ion particle beam machining optical system 100 having the functions of an ion particle beam machining apparatus, a scanning electron microscope optical system 200 having the functions of a scanning electron microscope, a stage device 300 that moves a sample (wafer) 10 in a tertiary direction while rotatively moving it around a Z axis, a control device that controls these devices, a display device 23 that displays images obtained by the ion particle beam machining optical system and scanning electron microscope optical system, and a calculator 24 that executes various calculations and image processes. The charged particle beam application apparatus is used to machine semiconductor wafers. The ion particle beam machining optical system has a function to machine a predetermined circuit pattern in a semiconductor wafer and cut the wafer into pieces of an arbitrary size as samples. The scanning electron microscope optical system observes the predetermined circuit pattern in the semiconductor wafer to measure the size of the pattern.

The charged particle beam application apparatus in the present example machines semiconductor wafers of φ300 mm. The accuracy with which the stage device 300 is mechanically stopped is at most ±1 μm from a target value.

The ion particle beam machining optical system 100 has an ion source 101, an ion particle beam condenser lens 103 and an ion particle beam objective 104 that focus an ion particle beam 102 from the ion source, an ion particle beam deflector 105 that scans the focused ion particle beam 102, and an ion particle beam detector 106 that detects a secondary particle beam generated from the sample (wafer) 10. These components are installed in an ion particle beam mirror piece 107. The ion particle beam machining optical system is supplied with power from an ion particle beam lens power source 108.

The scanning electron microscope optical system 200 has an electron gun 201, a scanning electron microscope condenser lens 203 and a scanning electron microscope objective 204 that focus an electron beam 202 from the electron gun, a scanning electron microscope deflector 205 that scans the focused electron beam 202, and a scanning electron microscope detector 206 that detects a secondary particle beam generated from the sample (wafer) 10. These components are installed in a scanning electron microscope mirror piece 207. The scanning electron microscope optical system is supplied with power from a scanning electron microscope lens power source 208.

The stage device 300 has a sample stage 301 that supports the sample (wafer) 10, an R stage 302*d* that rotatively moves the sample stage 301 around a Z axis, an X stage 302*a* and a Y stage 302*b* that moves the sample stage 301 in a horizontal direction, and a Z stage 302*c* that moves the sample stage 301 in a vertical direction. These components are provided in a vacuum chamber 303.

The stage device 300 further has a laser measuring machine 311 and a mirror 312 which are used to measure the movement of the sample stage 301 in the horizontal direction, a Z sensor 313 that measures the amount of changes in the sample (wafer) 10 in the vertical direction, and a stage control device 315 to which outputs from the laser measuring machine 311 and Z sensor 313 are inputted and which controls the movements of the R stage 302*d*, an X stage 302*a*, a Y state 302*b*, and the Z stage 302*c*.

The ion particle beam 102 from the ion source 101 is focused by the ion particle beam condenser lens 103 and ion particle beam objective 104. The ion particle beam 102 is then scanned by the ion particle beam deflector 105 and then applied to a target on the sample (wafer) 10. The ion particle beam detector 106 detects a secondary particle beam generated from the sample (wafer) 10 and transmits an output signal to the calculator 24 via the control device 22. The calculator 24 executes image processing to generate an image signal and then transmits the signal to the display device 23. The display device 23 displays an image generated by the ion particle beam machining optical system.

At the same time, the electron beam 202 from the electron gun 201 is focused by the scanning electron microscope condenser lens 203 and scanning electron microscope objective 204. The electron beam 202 is then scanned by the scanning electron microscope deflector 205 and then applied to a target on the sample (wafer) 10. The scanning electron microscope detector 206 detects a secondary particle beam generated from the sample (wafer) 10 and transmits an output signal to the calculator 24 via the control device 22. The calculator 24 executes image processing to generate an image signal and then transmits the signal to the display device 23. The display device 23 displays an image generated by the scanning electron microscope optical system.

The calculator 24 has a correction table as described later. When the focal distance is changed in the ion particle beam machining optical system 100 or scanning electron microscope optical system 200, the calculator 24 calculates the movement of the sample stage so that the target position on the sample, that is, a machined or observed point is always located in the center of a visual field of a screen of the display device 23. If the focal distances of the ion particle beam machining optical system 100 and scanning electron microscope optical system 200 are not equal on the sample and if the ion particle beam machining optical system 100 is switched to the scanning electron microscope optical system 200, the calculator 24 calculates the movement of the sample stage so that the target position on the sample, that is, the machined or observed point is always located in the center of the visual field of the screen of the display device 23.

As shown in FIG. 4A, the ion beam 102 and the electron beam 202 are arranged at 90° from each other in a horizontal plane. As shown in FIG. 4B, the ion beam 102 and the electron beam 202 are inclined from the sample (wafer) 10 through 45°

The ion beam 102 is focused on the sample (wafer) 10 by allowing the control device 22 to control the ion beam lens power source 108 and adjusting the strength of the ion objective lens 104. The electron beam 202 is focused on the sample (wafer) 10 by allowing the control device 22 to control the scanning electron microscope lens power source 208 and adjusting the lens intensity of the scanning electron microscope objective 204.

The same point of the sample (wafer) 10 is irradiated with the ion particle beam 102, the electron beam 202, and a particle beam or light beam from the Z sensor 313. The amount by which the ion particle beam 102 and the electron beam 202 deviate from the focus is corrected by moving the R stage 302*c*.

The present example comprises the R stage 302*d*, and JP Patent Publication (Kokai) No. 2002-148159 discloses a method of producing a sample using the R stage 302*d*. The method of sample production disclosed in this publication comprises inclining the ion particle beam mirror piece 207 from the sample (wafer) 10 and rotating the R stage 302*d* to extract sample pieces.

Figure 2:
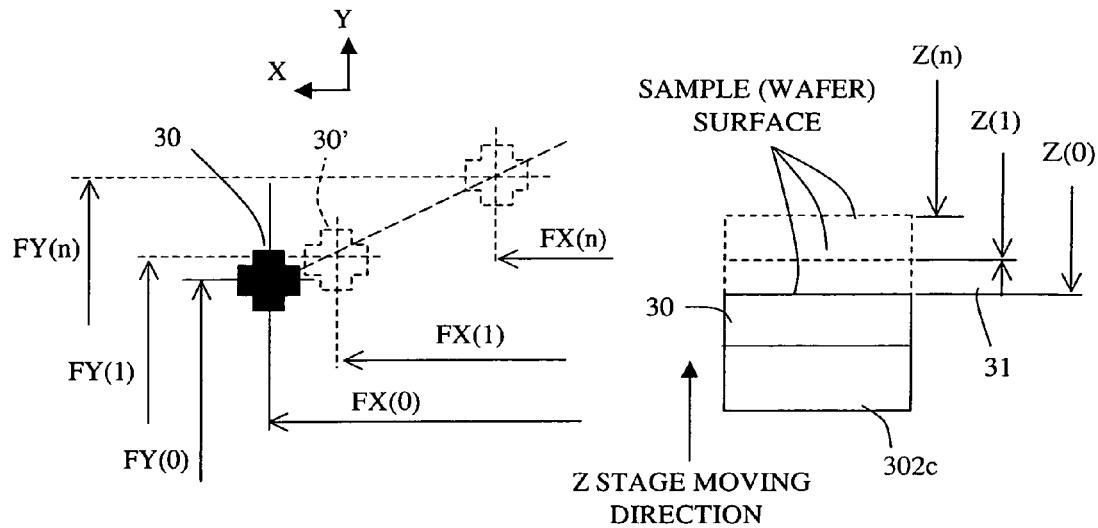
FIG. 2 is a plan view showing a method of calculating correction tables for an ion particle beam machining optical system of the charged particle beam application apparatus according to the present invention.

Now, with reference to FIG. 2, description will be given of a method of calculating correction tables for the ion particle beam machining optical system 100. As shown in FIG. 2, a target mark 30 is formed on a surface of the sample (wafer) 10. In the present example, the target mark 30 is shaped like a cross of length 10 $\mu$m and width 10 $\mu$m. FIG. 2 schematically shows an image of the target mark 30 obtained with an optical magnification of about 2,500.

First, the sample 10 is moved in the horizontal direction using the X stage 302*a* and the Y stage 302*b* and to an arbitrary height using the Z stage 302*c* so that the target mark 30 can be observed on the screen of the display device 23. Thus, the sample 10 is placed at an initial position. The Z sensor 313 is used to measure the position of the target mark 30 in the Z direction. The value obtained is defined as Z(0).

Then, the ion particle beam 102 is focused on the target mark 30 while observing the target mark 30 on the screen of the display device 23. At this time, optical system conditions for the ion particle beam machining optical system 100 are defined as FP(0). Here, the optical system conditions are parameters such as voltages applied to the objective lens, the polarizer, and the condenser lens to control the lens strength and the charged particle beam. Then, on the basis of the results of image processing executed by the control device 22 and calculator 24, the stage control device 315 finely adjusts the X stage 302*a* and Y stage 302*b* such that the center of the target mark 30 coincides with the center of the visual field of the screen. In this case, the laser measuring machine 311 is used to measure the positions of the sample stage in the X and Y directions. The values obtained are defined as FX(0) and FY(0).

Then, the Z stage 302*c* is moved by a predetermined specified amount 31. The Z sensor 313 is then used to measure the position of the target mark 30 in the Z direction. The value obtained is defined as Z(1). When the Z stage 302*c* is moved by the predetermined specified amount 31, the focus of the ion particle beam 102 deviates from the target mark 30. The target mark 30 thus deviates from the center of the visual field of the screen of the display device 23. A broken cross 30' shows the target mark 30 moved on the screen of the display device 23.

Accordingly, the focus of the ion particle beam 102 is made to coincide with the target mark 30. The optical system conditions for the ion particle beam machining optical system at this time are defined as FP(1). The X stage 302a and the Y stage 302b are finely adjusted so that the positionally deviating center of the target mark 30 coincides with the center of the visual field of the screen. In this case, the laser measuring machine 311 is used to measure the positions of the sample stage in the X and Y directions. The values obtained are defined as FX(1) and FY(1).

This operation is repeated n times to obtain n+1 sets of data composed of the positions FX(0), FY(0), FX(1), FY(1), ..., FX(n), FY(n) of the sample stage in the X and Y directions, the position Z(0), Z(1), ..., Z(n) of the target mark 30 in the Z direction, and the optical system conditions FP(0), FP(1), ..., FP(n) for the ion particle beam machining optical system.

The position of the target mark 30 in the [Z] direction is assumed to be expressed using a linear expression with the position [FX] of the sample stage in the X direction, the position [FY] of the sample stage in the Y direction, and the optical conditions [FP] for the ion particle beam machining optical system.

[Equation 1]

$$[Z]=cF \cdot [FX]+dF \quad (51)$$

$$[Z]=eF \cdot [FY]+fF \quad (53)$$

$$[Z]=cO \cdot [FP]+dO \quad (55)$$

cF, dF, eF, fF, cO, and dO are coefficients. The coefficients cF, dF, eF, fF, cO, and dO are calculated by the calculator 24 using the above n+1 sets of data. Substituting the calculated coefficients cF, dF, eF, fF, cO, and dO into Equations (51), (53), and (55) yields the relationship between the position [Z] of the target mark 30 in the Z direction and the position [FX] of the sample stage in the X direction, the relationship between the position [Z] of the target mark 30 in the Z direction and the position [FY] of the sample stage in the Y direction, and the relationship between the position of the target mark 30 in the Z direction [Z] and the optical system conditions [FP] for the ion particle beam machining optical system.

Figure 5:
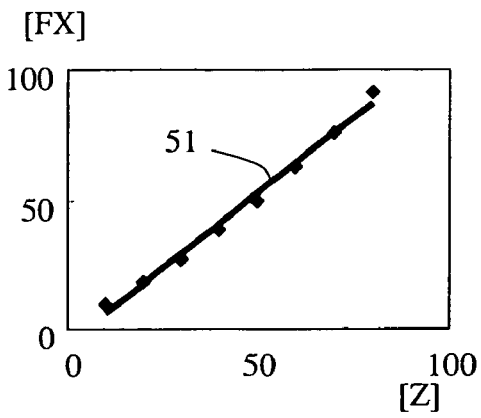
FIG. 5 is a diagram showing correction tables created on the basis of correction equations for the ion particle beam machining optical system and scanning electron microscope optical system.
Figure 5:
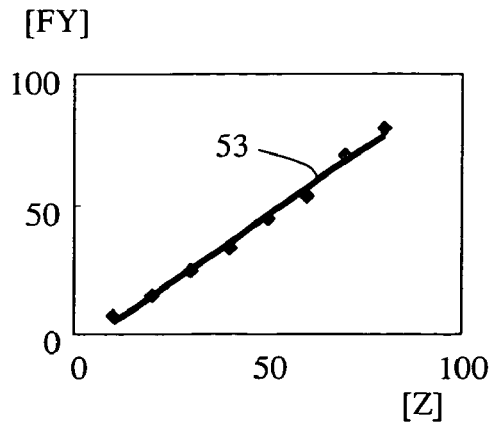
Figure 5:
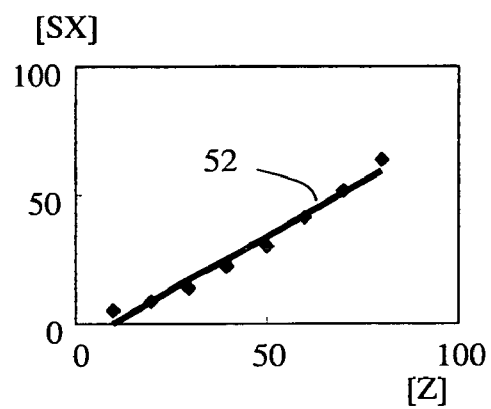
Figure 5:
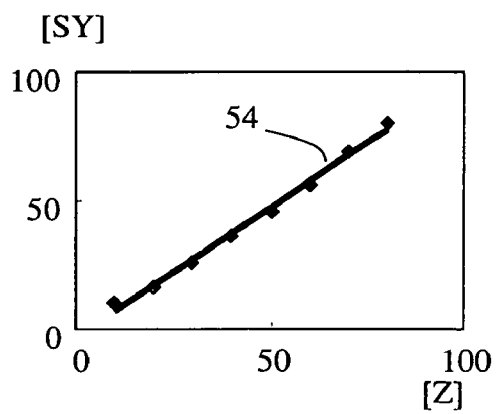
Figure 5:
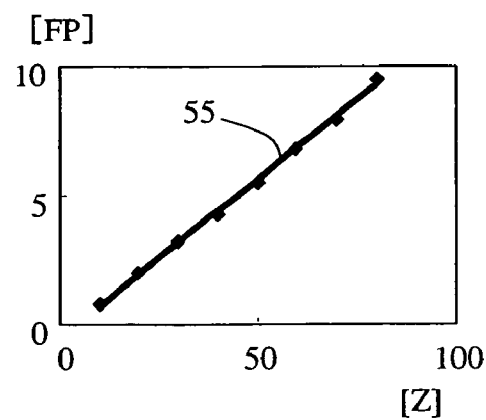
Figure 5:
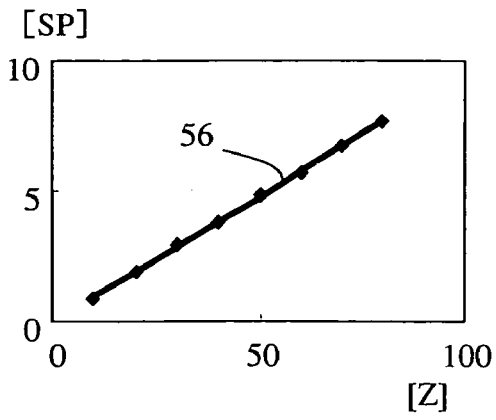
Figure 6:
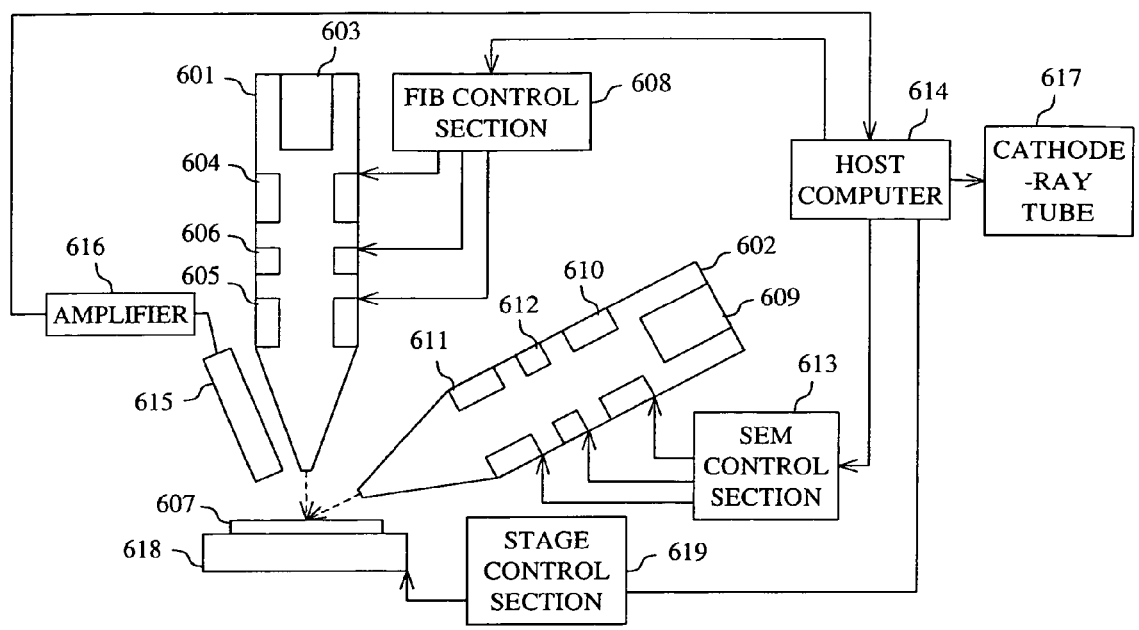
FIG. 6 is a diagram showing the configuration of a conventional dual beam apparatus (ion particle beam machining apparatus-scanning electron microscope) using charged particles.
Figure 7:
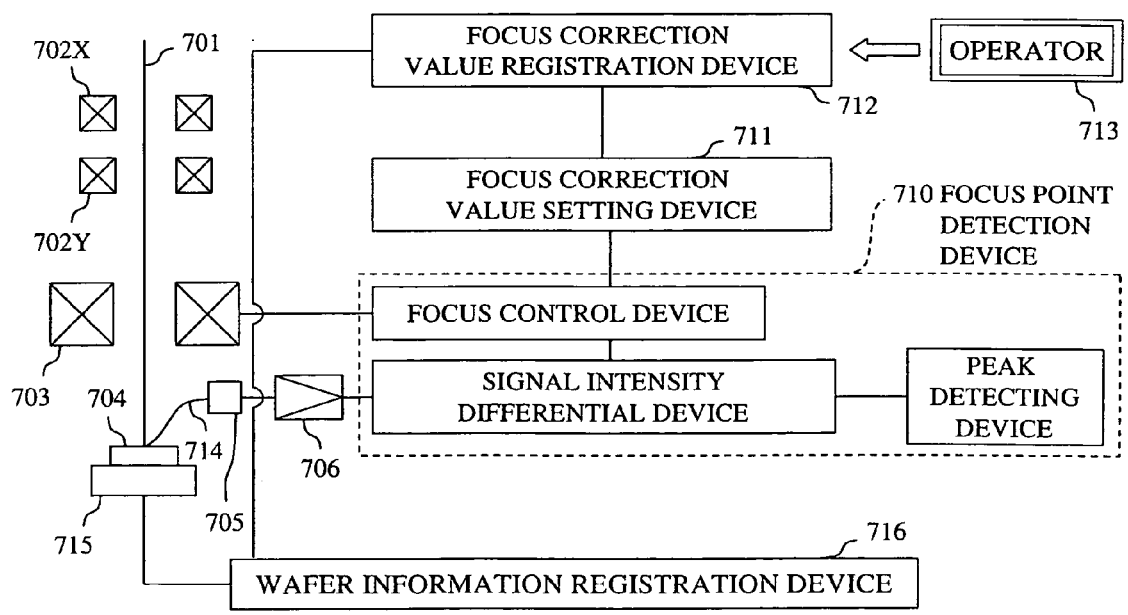
FIG. 7 is a diagram showing the configuration of a conventional scanning electron microscope automatic focusing mechanism.
Figure 8:
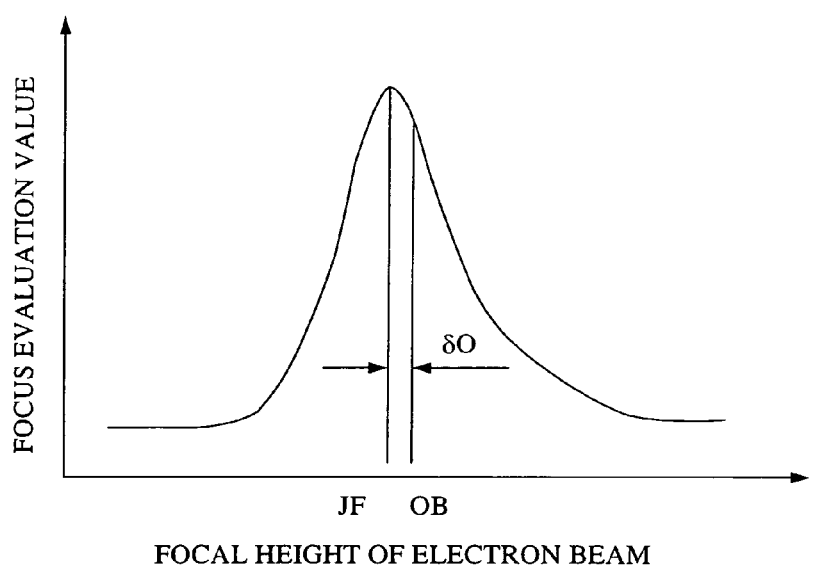
FIG. 8 is a distribution diagram for determinations for the conventional scanning electron microscope automatic focusing.
Figure 9:
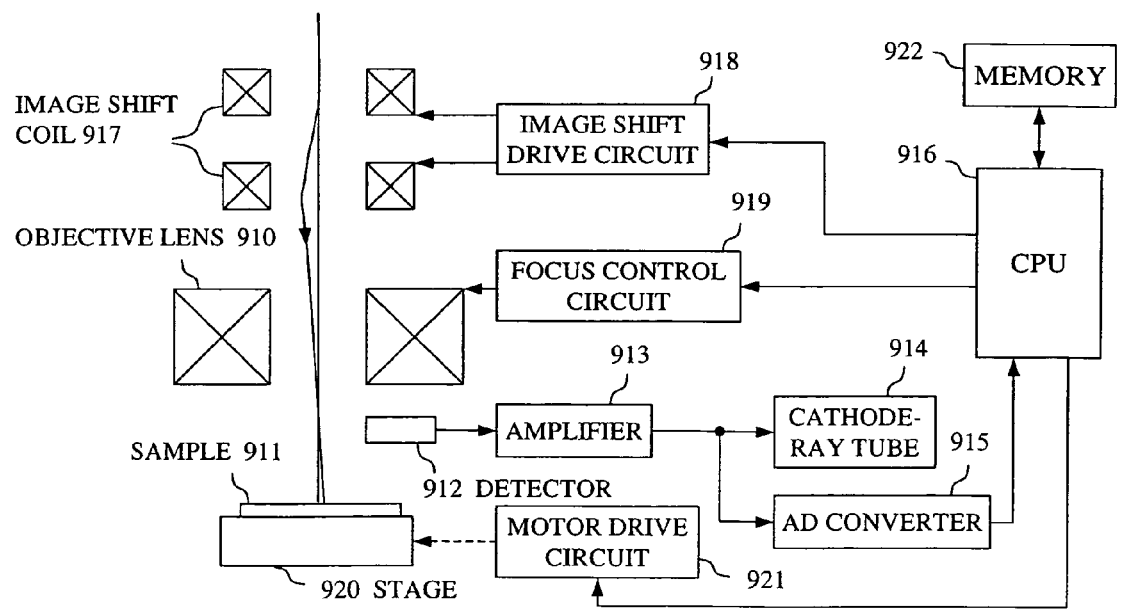
FIG. 9 is a diagram showing a configuration for a method of sample inclined observations in which a conventional U-centric stage is mounted so as to make focus corrections on the basis of image shifting.
Figure 10:
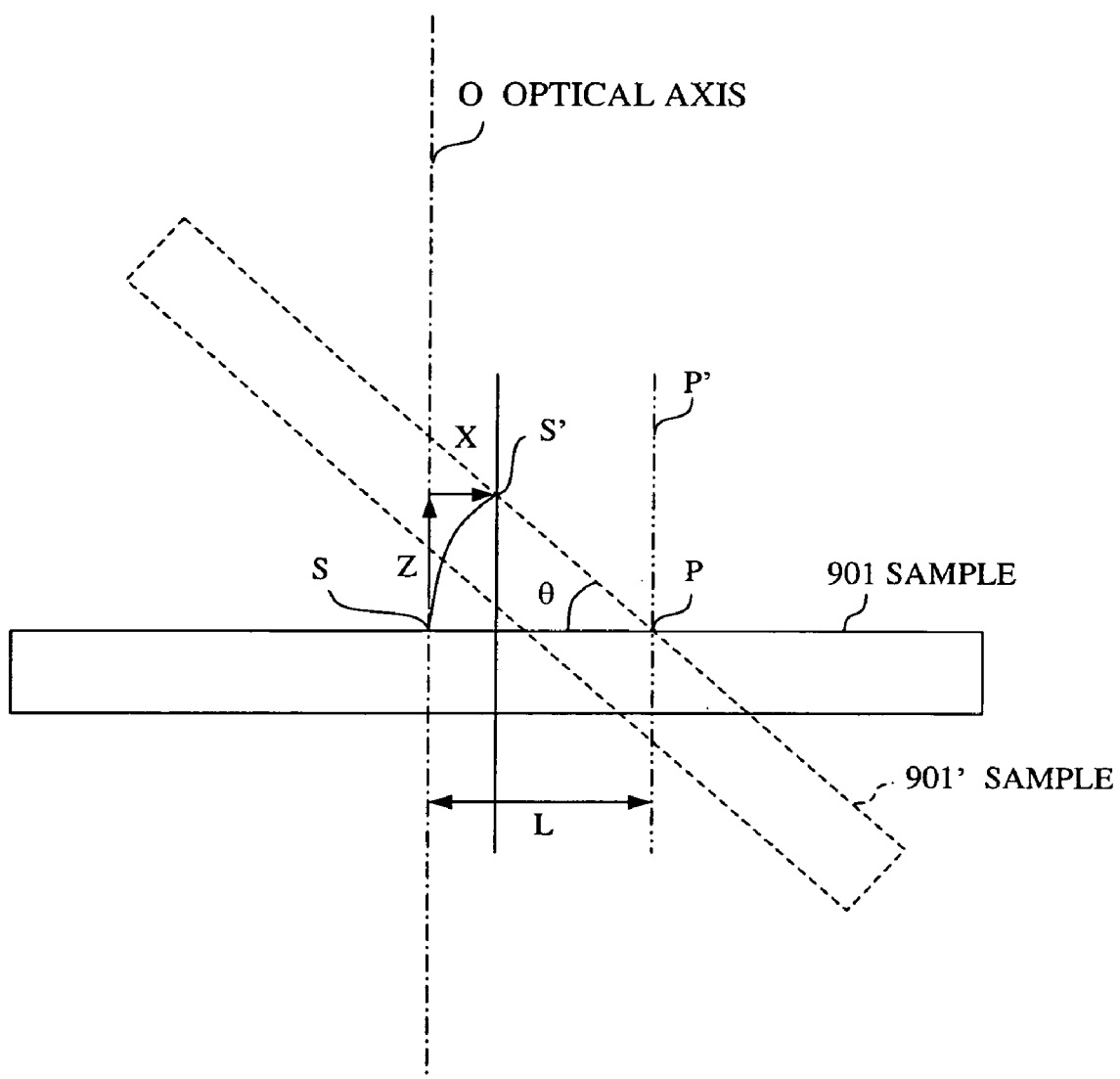
FIG. 10 is a plan view illustrating the amount of focus corrections for the conventional U-centric stage.

FIG. 5 shows correction tables 51, 53, and 55 for the ion particle beam machining optical system. The correction tables 51, 53, and 55 for the ion particle beam machining optical system are graphical representations of Equations (51), (53), and (55).

Figure 3:
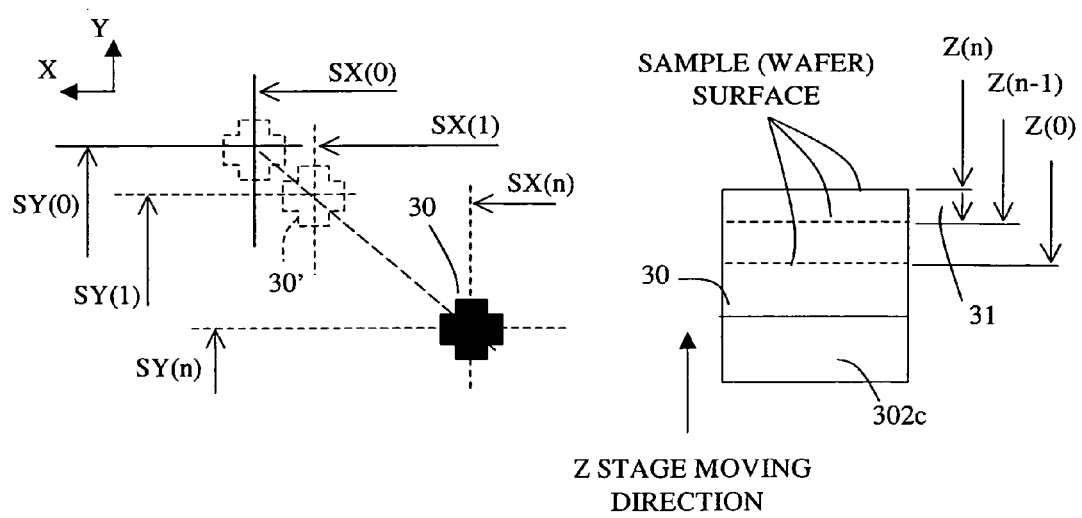
FIG. 3 is a plan view showing a method of calculating correction tables for an ion particle beam machining optical system of the charged particle beam application apparatus according to the present invention.

With reference to FIG. 3, description will be given of a method of calculating correction tables for the scanning electron microscope 200. This method is similar to the method of calculating correction tables for the ion particle beam machining optical system. However, this method proceeds in the opposite direction. First, the sample 10 is moved so that the target mark 30 can be observed on the screen of the display device 23. Then, the Z stage 302c is used to move the sample 10 to an arbitrary position. The Z sensor 313 is then used to measure the position of the target mark 30 in the Z direction. The value obtained is defined as Z(n). The focus of the electron beam 202 is adjusted while observing the target mark 30 on the screen of the display device 23. The optical condition of the scanning electron microscope 200 at this time is referred to as SP(n).

Then, the center of the target mark 30 is made to coincide with the center of the visual field of the screen. At this time, the positions of the sample stage in the X and directions are defined as SX(n) and SY(n). Then, the Z stage 302c is returned, that is, moved in the opposite direction by the specified amount 31. At this time, the position of the target mark 30 in the Z direction is defined as Z(n−1). The focus of the electron beam 202 is made to coincide with the target mark 30. The optical system conditions for the scanning electron microscope 200 at this time are defined as FP(n−1). The X stage 302a and the Y stage 302b are finely adjusted so that the positionally deviating center of the target mark 30 coincides with the center of the visual field of the screen. At this time, the positions of the sample stage in the X and directions are defined as FX(n−1) and FY(n−1).

This operation is repeated n times to obtain n+1 sets of data composed of the positions SX(n), SY(n), SX(n−1), SY(n−1), ..., SX(0), SY(0) of the sample stage in the X and Y directions, the position Z(n), Z(n−1), ..., Z(0) of the target mark 30 in the Z direction, and the optical system conditions SP(n), SP(n−1), ..., SP(0) for the scanning electron microscope optical system.

The position of the target mark 30 in the [Z] direction is assumed to be expressed using a linear expression with the position [SX] of the sample stage in the X direction, the position [SY] of the sample stage in the Y direction, and the optical conditions [SP] for the ion particle beam machining optical system.

[Equation 2]

$$[Z]=cS \cdot [SX]+dS \quad (52)$$

$$[Z]=eS \cdot [SY]+fS \quad (54)$$

$$[Z]=aO \cdot [SP]+bO \quad (56)$$

cS, dS, eS, fS, aO, and bO are coefficients. The coefficients cS, dS, eS, fS, aO, and bO are calculated by the calculator 24 using the above n+1 sets of data. Substituting the calculated coefficients cS, dS, eS, fS, aO, and bO into Equations (52), (54), and (56) yields the relationship between the position [Z] of the target mark 30 in the [Z] direction and the position [SX] of the sample stage in the X direction, the relationship between the position [Z] of the target mark 30 in the Z direction and the position [SY] of the sample stage in the Y direction, and the relationship between the position of the target mark 30 in the Z direction [Z] and the optical system conditions [SP] for the ion particle beam machining optical system.

FIG. 5 shows the correction tables 52, 54, and 56 for the scanning electron microscope 200. The correction tables 52, 54, and 56 for the ion particle beam machining optical system are graphical representations of Equations (52), (54), and (56).

In the present example, the calculation of the correction tables is premised on the previous individual adjustments of the ion particle beam machining optical system and scanning electron microscope optical system. Further, in the present example, the correction tables are linear. However, polynomials may be used for corrections. Moreover, correction tables may be similarly calculated for the R stage 302d so that the X, R, Z stages or the Y, R, and Z stages can be used to create correction tables.

Additionally, at least two of Equations (51), (53), and (55), expressing the correction tables for the ion particle beam machining optical system 100, are subjected to an addition or a subtraction to obtain a linear relationship between the position [Z] of the target mark 30 in the Z direction and at least two of the three variables [FX], [FY], and [FP]. At least two of Equations (52), (54), and (56), expressing the correction tables for the scanning electron microscope optical system 200, are subjected to an addition or a subtraction to obtain a linear relationship between the position [Z] of the target mark 30 in the Z direction and at least two of the three variables [SX], [SY], and [SP]. The linear relationships thus obtained may be expressed in a graph to create correction tables.

Moreover, Equations (51), (53), and (55), expressing the correction tables for the ion particle beam machining optical system 100, and Equations (52), (54), and (55), expressing the correction tables for the scanning electron microscope optical system 200, are subjected to an addition or a subtraction to obtain a linear relationship between the position [Z] of the target mark 30 in the Z direction and the six variables [FX], [FY], [FP], [SX], [SY], and [SP]. This results in a correction table for the ion particle beam machining optical system and scanning electron microscope optical system.

Figure 4:
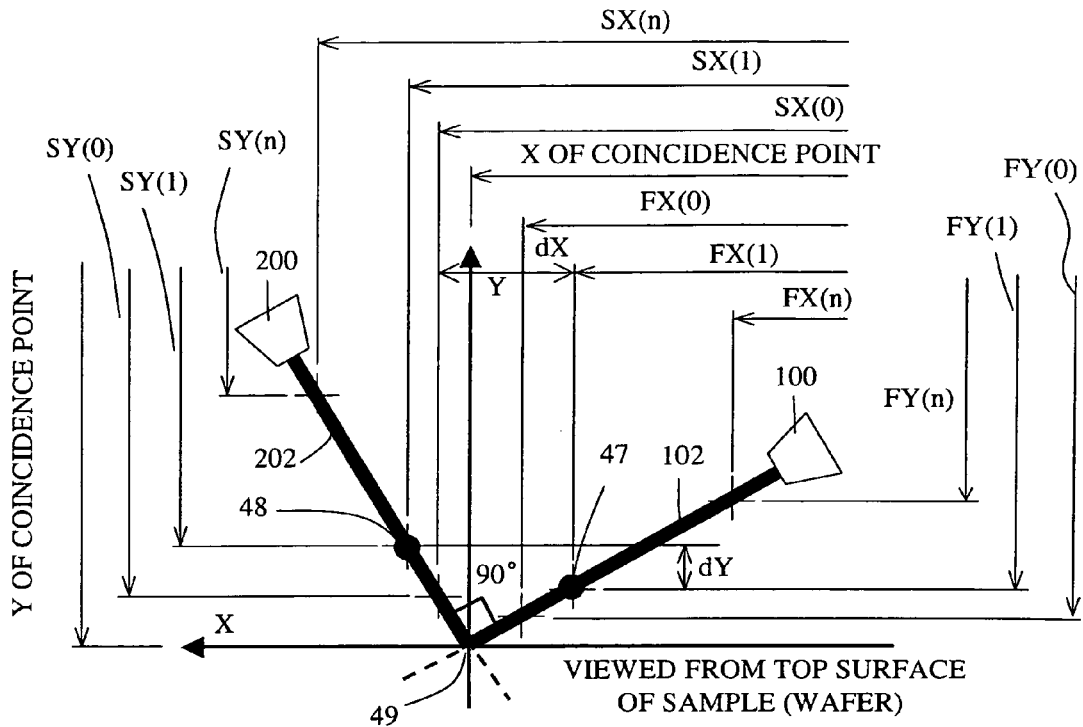
FIG. 4 is a diagram showing the relationship between the focal distances of the ion particle beam machining optical system and scanning electron microscope optical system of the charged particle beam application apparatus according to the present invention and an X, Y, and Z stage positions.
Figure 4:
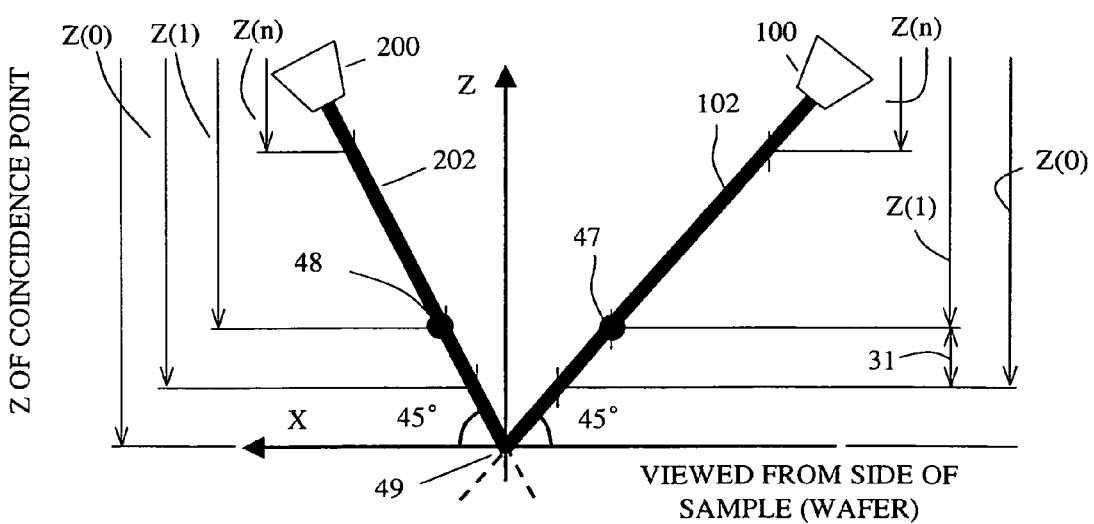

Description will be given with reference to FIG. 4. FIG. 4A is a diagram showing the ion particle beam 102 from the ion particle beam machining optical system 100 and the electron beam 202 from the scanning electron microscope 200 both projected on an xy plane. FIG. 4B is a diagram showing the ion particle beam 102 from the ion particle beam machining optical system 100 and the electron beam 202 from the scanning electron microscope 200 both projected on an xz plane. As shown in FIG. 4, the mechanical optical axis of the ion particle beam machining optical system 100 crosses the mechanical optical axis of the scanning electron microscope optical system at a point 49.

It is assumed that the foci of the ion particle beam 102 and electron beam 202 coincide with each other at the point 49. First, the ion particle beam machining optical system 100 moves the target on the sample (wafer) in the horizontal and vertical directions to place it at the initial position. At the initial position, the position in the Z direction is defined as Z(0), and the positions in the X and Y directions are defined as FX(0) and FY(0), respectively. Then, the focus of the ion particle beam 102 is changed from the point 49 to a point 47 on the sample 10. Thus, the focus of the ion particle beam 102 coincides with the target on the sample.

Next, it is assumed that the scanning electron microscope optical system 400 is used to observe the same target on the sample 10 without changing the height of the sample. In this case, it is only necessary to move the sample in the X and Y directions, while changing the focus of the electron beam 202 from the point 49 to a point 48. The movements of the sample in the X and Y directions are expressed by the amounts of differentials (dX, dY) as shown in Equations (61) and (62).

[Equation 3]

$$dX = SX(1) - FX(1) \quad (61)$$

$$dY = SY(1) - FY(1) \quad (62)$$

Now, description will be given of a procedure of applying the correction tables. The correction tables for the ion particle beam machining optical system are used for the ion particle beam machining optical system 100 if the focal distance of the particle beam 102 is changed. The calculator 24 calculates the amounts of correction for the positions in the X, Y, and Z directions in association with the movement of the focus. The calculator 24 then outputs data on these amounts to the stage control device 315 to move the sample stage. Thus, even if the focal distance of the particle beam 102 changes, the target on the sample, that is, the machined or observed point remains in the center of the visual field of the screen of the display device 23.

The scanning electron microscope correction tables are used for the scanning electron microscope optical system 200 if the focal distance of the electron beam 202 on the sample is changed. The calculator 24 calculates the amounts of correction for the positions in the X, Y, and Z directions in association with the movement of the focus. The calculator 24 then outputs data on these amounts to the stage control device 315 to move the sample stage. Thus, even if the focal distance of the electron beam 202 changes, the target on the sample, that is, the machined or observed point remains in the center of the visual field of the screen of the display device 23.

The correction tables for the ion particle beam machining optical system and scanning electron microscope optical system are used if the optical system used is switched between the ion particle beam machining optical system 100 and the scanning electron microscope optical system 200. The calculator 24 calculates the amounts of correction for the X and Y directions corresponding to the height of the sample after switching. The calculator 24 then outputs data on these amounts to the stage control device 315 to move the sample stage.

Further, the calculator 24 calculates the amount of correction on the basis of the optical conditions for the ion particle beam machining optical system or scanning electron microscope optical system to which the apparatus is to be switched. Thus, even after the optical system is switched, the machined or observed point on the sample remains in the center of the visual field of the screen of the display device 23.

Additionally, depending on the setting of the optical conditions for the ion particle beam machining optical system or scanning electron microscope optical system, it is possible to make the center of the visual field to coincide with the focus even if the focal distance of the ion particle beam machining optical system is different from that of the scanning electron microscope optical system and if the work distance is changed to switch the machining or observing operation between the ion particle beam machining optical system and the scanning electron microscope optical system.

The examples of the present invention have been described. However, the present invention is not limited to above examples. Those skilled in the art will appreciate that various changes may be made to the examples without departing from the scope of the invention set forth in the claims.

According to the present invention, in a charged particle beam application apparatus having one or more charged particle beams inclined from a sample, even if the focal distance of the charged particle beam used is changed, a processed or observed point that is a target can be reliably placed in the center of a visual field of a display screen.

According to the present invention, in the charged particle beam application apparatus having one or more charged particle beams inclined from the sample, even if the charged particle beam used is switched, the processed or observed point, which is a target, can be reliably placed in the center of the visual field of the display screen.

According to the present invention, in the charged particle beam application apparatus having one or more charged particle beams inclined from the sample, even if the focal distance of the charged particle beam used is changed, a sample stage can be moved to a predetermined position in a short time.

According to the present invention, in the charged particle beam application apparatus having one or more charged particle beams inclined from the sample, even if the charged particle beam used is switched, the sample stage can be moved to the predetermined position in a short time.

What is claimed is:

1. A charged particle beam application apparatus having a stage device used to move a sample in at least three axial directions, a charged particle beam optical system having an optical axis inclined from a surface of said sample to irradiate the sample with a charged particle beam, and a display device that displays an image formed by the charged particle beam optical system, the apparatus comprising:
   a correction table indicating a relationship between focal distance and a position of said sample and a relationship between optical conditions for said charged particle beam optical system and a position of said sample, and an arithmetic section that calculates the position of said sample, the arithmetic section calculating the amount of three-dimensional correction for the position of said sample using said correction table, so that when the focal distance of said charged particle beam changes, a position of a target on said sample is placed in the center of a visual field of a screen of said display device, wherein said correction table is created by assuming that a position [Z] of said sample in a Z direction is expressed using a linear expression with a position [X] of said sample in an X direction, a position [Y] of said sample in a Y direction, and optical conditions [P] for the charged beam optical system.

2. The charged particle beam application apparatus according to claim 1, wherein said charged particle beam optical system includes a plurality of charged particle beam optical systems, and even when said charged particle beam optical system is switched, the position of the target on said sample remains in the center of the visual field of the screen of said display device.

3. The charged particle beam application apparatus according to claim 2, wherein if the same target on said sample is observed without changing the height of said sample even when said charged particle beam optical system is switched, then the focal distance of said charged particle beam optical system is changed and said sample is moved in the X and Y directions by an amount equal to the following differential (dX, dY), $$dX = SX(1) - FX(1)$$

$$dY = SY(1) - FY(1)$$

where FX(1) and FY(1) denote the position of the sample in the charged particle beam optical system before the switching and SX(1) and SY(1) denote the position of the sample in the charged particle beam optical system after the switching.

* * * * *